(12) United States Patent
Erhardt et al.

(10) Patent No.: US 6,815,233 B1
(45) Date of Patent: Nov. 9, 2004

(54) METHOD OF SIMULTANEOUS DISPLAY OF DIE AND WAFER CHARACTERIZATION IN INTEGRATED CIRCUIT TECHNOLOGY DEVELOPMENT

(75) Inventors: Jeffrey P. Erhardt, San Jose, CA (US); Shivananda S. Shetty, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/460,615

(22) Filed: Jun. 11, 2003

(51) Int. Cl.[7] ............ G01R 31/26; H01L 21/66
(52) U.S. Cl. ............ 438/14; 324/765; 382/145; 382/151
(58) Field of Search ............ 438/250, 257, 438/14, 18; 324/158.1, 765, 714; 382/145, 151; 257/48

(56) References Cited

U.S. PATENT DOCUMENTS

| | | | | |
|---|---|---|---|---|
| 5,359,531 A | * | 10/1994 | Iwamoto et al. | 700/146 |
| 6,078,183 A | * | 6/2000 | Cole, Jr. | 324/752 |
| 6,128,403 A | * | 10/2000 | Ozaki | 382/145 |
| 2003/0173990 A1 | * | 9/2003 | Nanbu | 324/765 |
| 2003/0198375 A1 | * | 10/2003 | Lepejian | 382/149 |

* cited by examiner

*Primary Examiner*—David Zarneke
*Assistant Examiner*—Thanh Y. Tran
(74) *Attorney, Agent, or Firm*—Mikio Ishimaru

(57) ABSTRACT

A system for processing tester information is provided. Data is collected for a plurality of dies on a semiconductor wafer. Data and a pattern covering the semiconductor wafer are selected. Selected data are graphed in a trellis of graphs spread across the semiconductor wafer. The trellis of graphs is oriented over an outline of the semiconductor wafer.

20 Claims, 4 Drawing Sheets

METHOD OF SIMULTANEOUS DISPLAY OF DIE AND WAFER CHARACTERIZATION IN INTEGRATED CIRCUIT TECHNOLOGY DEVELOPMENT

BACKGROUND

1. Technical Field

The present invention relates generally to semiconductor technology and more specifically to semiconductor research and development.

2. Background Art

At the present time, electronic products are used in almost every aspect of life, and the heart of these electronic products is the integrated circuit. Integrated circuits are used in everything from computers and radios to televisions.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not a solution for major problems.

The problems include, but are not limited to, the need to visualize the spatial dependency of detailed semiconductor device characterization data.

The problems include, but are not limited to, unlinked queries for data visualization.

The problems include, but are not limited to, classification of in-line defects.

The problems include, but are not limited to, difficulties with in-line defect kill rate prediction and image recognition.

Solutions to these problems have been long sought but prior developments have not taught or suggested any solutions and, thus, solutions to these problems have long eluded those skilled in the art.

DISCLOSURE OF THE INVENTION

The present invention provides a method for processing tester information. Data is collected for all dies on a semiconductor wafer. Data and a pattern covering the semiconductor wafer are selected. Selected data is graphed in a trellis of graphs spread across the semiconductor wafer. The trellis of graphs is oriented over an outline of the semiconductor wafer. This provides a methodology and output format to display die level and wafer level data simultaneously showing spatial dependencies that cannot be identified by other means.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
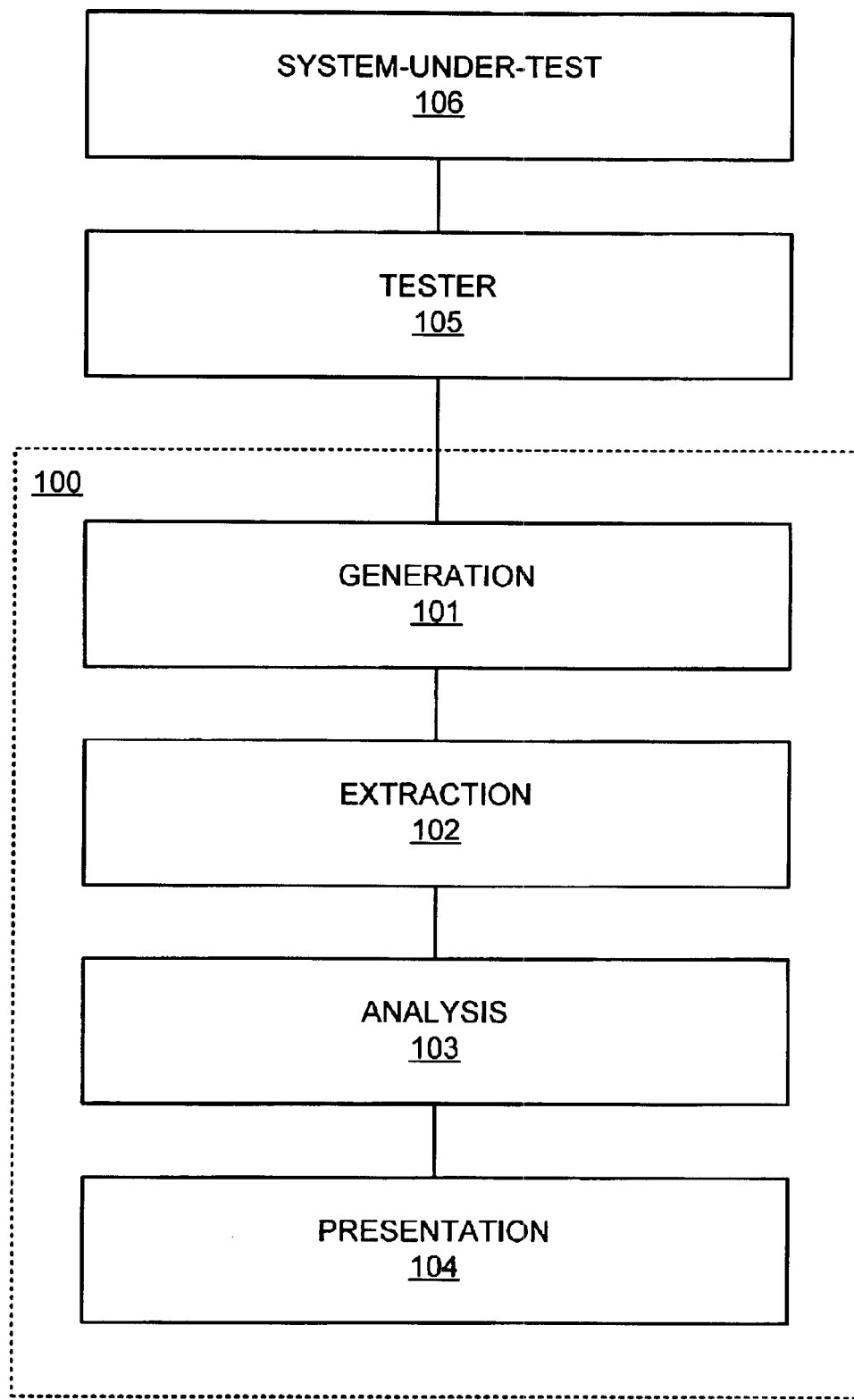
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, specialized circuitry, and/or computers, which operate on and manipulate information and/or data, which are generically defined herein as "information". The tester information processing system 100 receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, a conventional test information, a personal computer, etc. It may also require new equipment and/or methods, which are described herein when required.

In the extraction block 102, usable information is extracted from the generated information from the generation block 101. Essentially, the generated information is translated into more useful forms; e.g., broken apart so it can be reassembled in different forms to show different interrelationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
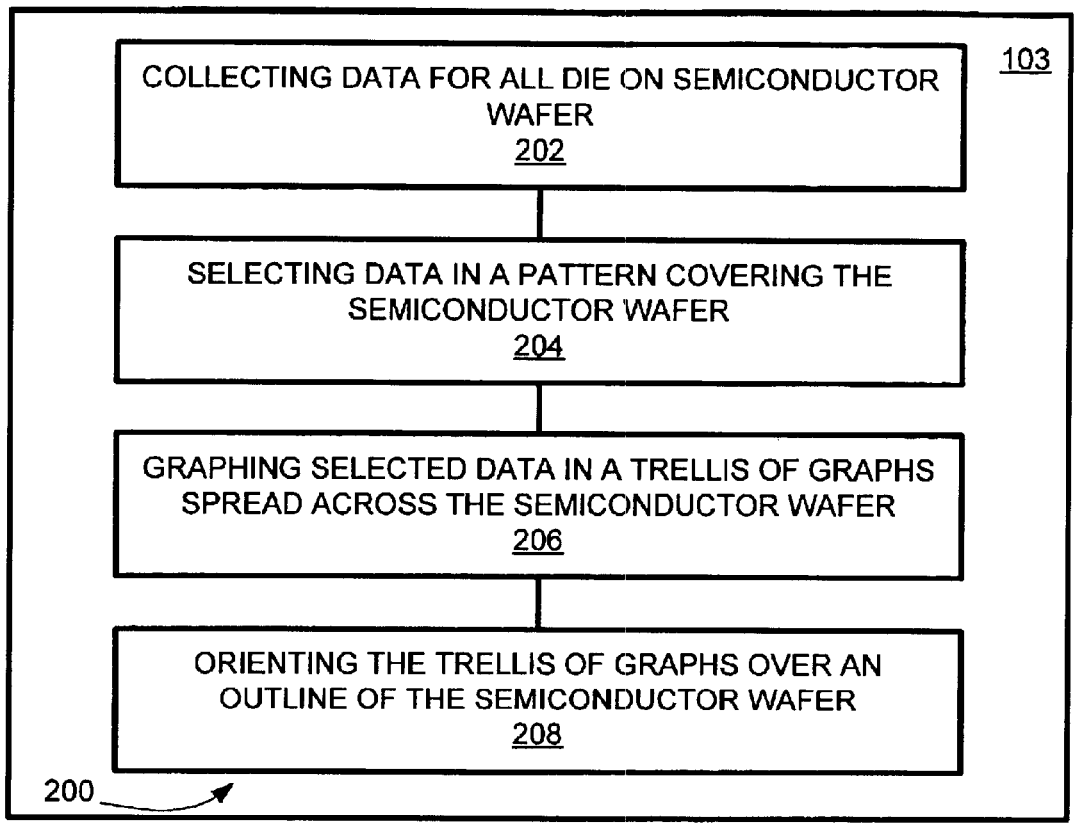
FIG. 2 is a system for displaying the spatial dependency of detailed semiconductor device characterization data in accordance with the present invention.

Referring now to FIG. 2, therein is shown a system 200 for displaying the spatial dependency of detailed semiconductor device characterization data in accordance with the present invention. The system 200 includes a step 202 of collecting data for all die on a semiconductor wafer; a step 204 of selecting data in a pattern covering the semiconductor wafer; a step 206 of graphing selected data in a trellis of graphs spread across the semiconductor wafer; and a step 208 of orienting the trellis of graphs over an outline of the semiconductor wafer.

It has been discovered that it is possible to simultaneously display die level and wafer level data by graphing the data two dimensionally from dies in particular areas of the semiconductor wafer and overlaying them in their respective regions over the semiconductor wafer.

Figure 3:
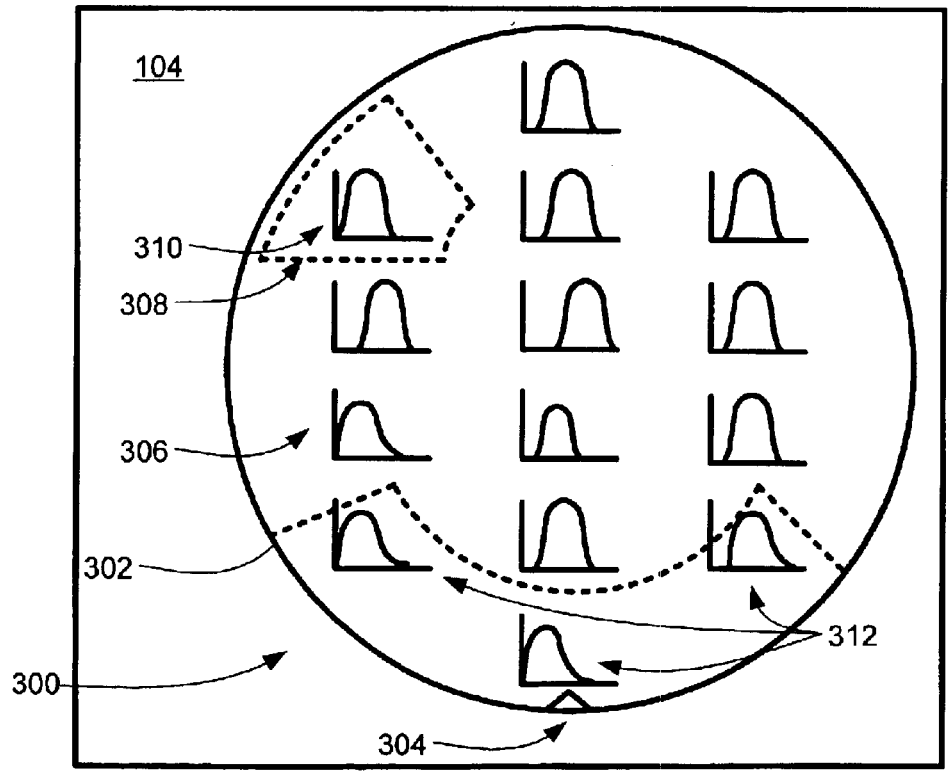
FIG. 3 is an exemplary display in accordance with the present invention.

Referring now to FIG. 3, therein is shown an exemplary display 300. The exemplary display 300 shows the outline of a semiconductor wafer 302 having an orientation notch 304.

Oriented over the outline of the semiconductor wafer 302 is a regular trellis of graphs 306 with the data from an area 308 being graphed on a single graph 310. The area 308 can be of any regular or irregular shape, such as a square, rectangle, polygon, arc sector, or a combination thereof of the semiconductor wafer.

Merely by looking at the exemplary display 300 of an outline of the semiconductor wafer 302, it may be seen that certain regions, such as the lower outer regions designated by graphs 312, exhibit a poor distribution and therefore that there may be a production problem in these areas. Thus, it is possible to immediately see the spatial dependencies that cannot be identified in any other way.

Examples of the type of data that may be displayed in this fashion are threshold voltage, device current, and device voltage.

It will be understood that different filters may be used for the data to further aid in data visualization as well as providing selective filtering to compensate for known variations, which occur spatially during processing on every semiconductor wafer.

Figure 4:
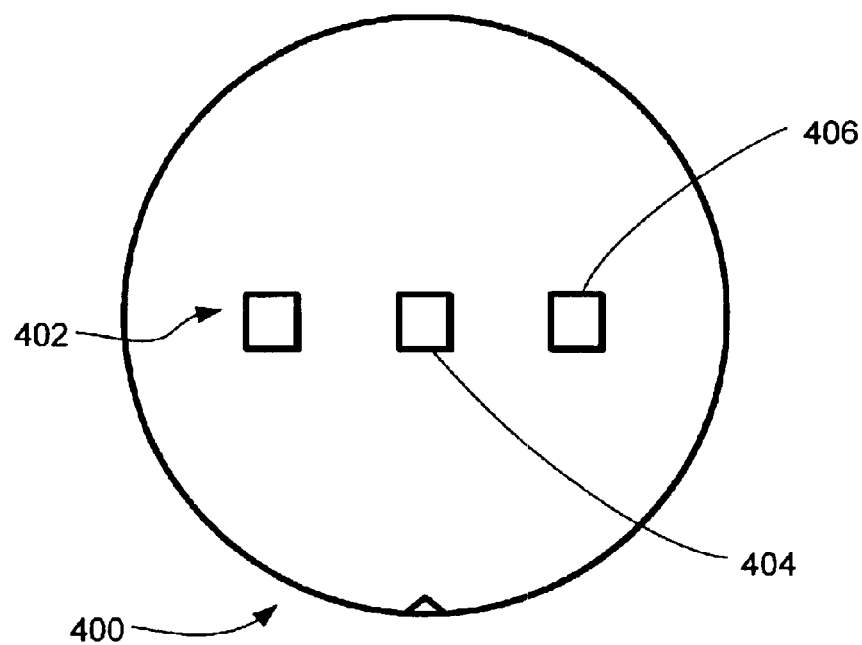
FIG. 4 a view of a semiconductor wafer subject to in-line testing of dies in accordance with the present invention.

Referring now to FIG. 4, therein is shown a semiconductor wafer 400 subject to in-line testing of dies 402.

During the in-line testing, it has been discovered that not all defects in the dies 402 are real defects. For example, a die 404, being centrally located, may sometimes be detected as a defective die, but in actuality it is not. This die would be considered to have a "soft" defect.

At the same time, a die 406 could have a "real" defect, which renders the die nonfunctional.

By developing a library to correlate the in-line defects, the in-line defects can be more accurately defined.

Figure 5:
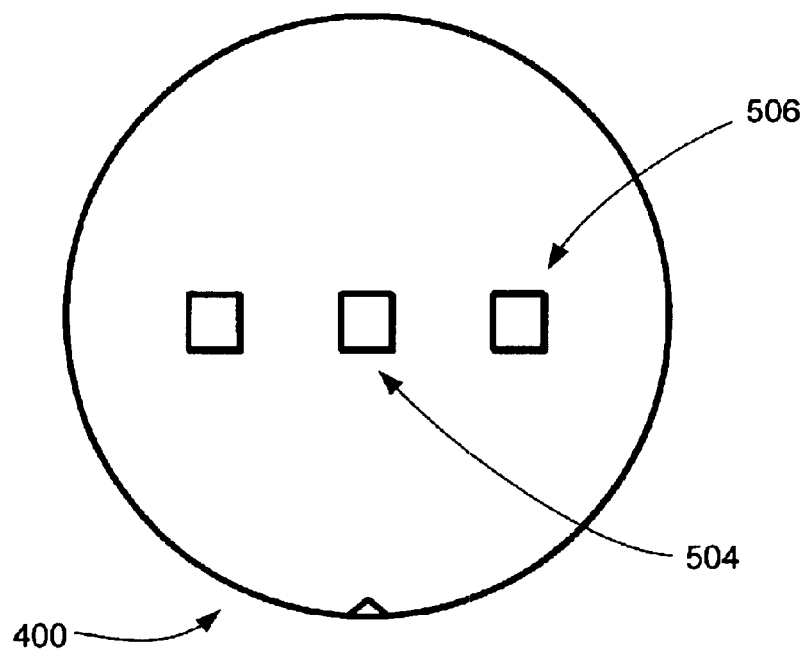
FIG. 5 is a view of the semiconductor wafer of FIG. 4 during die sort in accordance with the present invention.

Referring now to FIG. 5, therein is shown the semiconductor wafer 400 during die sort. In this situation, the library will determine that a die 504 is a good die while a die 506 will be classified as a bad die.

It has also been discovered that in-line defects can be classified by their images or shapes. By building an image library and a sort library correlating the images with good or bad die, it is possible that the kill rate can be predicted more accurately than by human-based classification.

Figure 6:
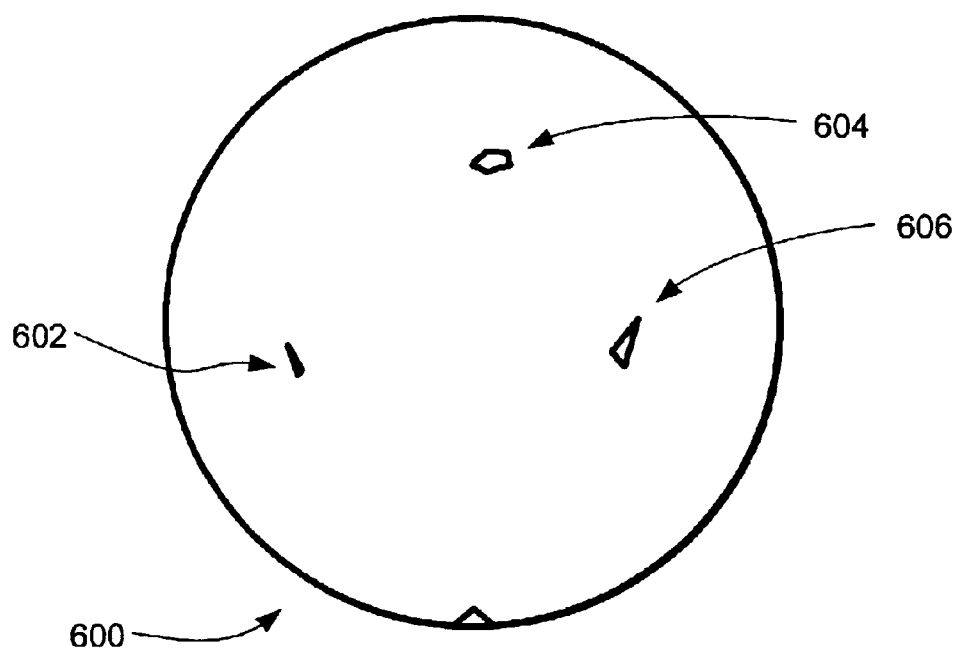
FIG. 6 is a view of a semiconductor wafer having defect images in accordance with the present invention.

Referring now to FIG. 6, therein is shown a semiconductor wafer 600 having defect images 602, 604, and 606. The three images are of different sizes and different shapes.

By building an image library and a sort library, it can be predicted what the kill rate will be for each size and shape.

Figure 7:
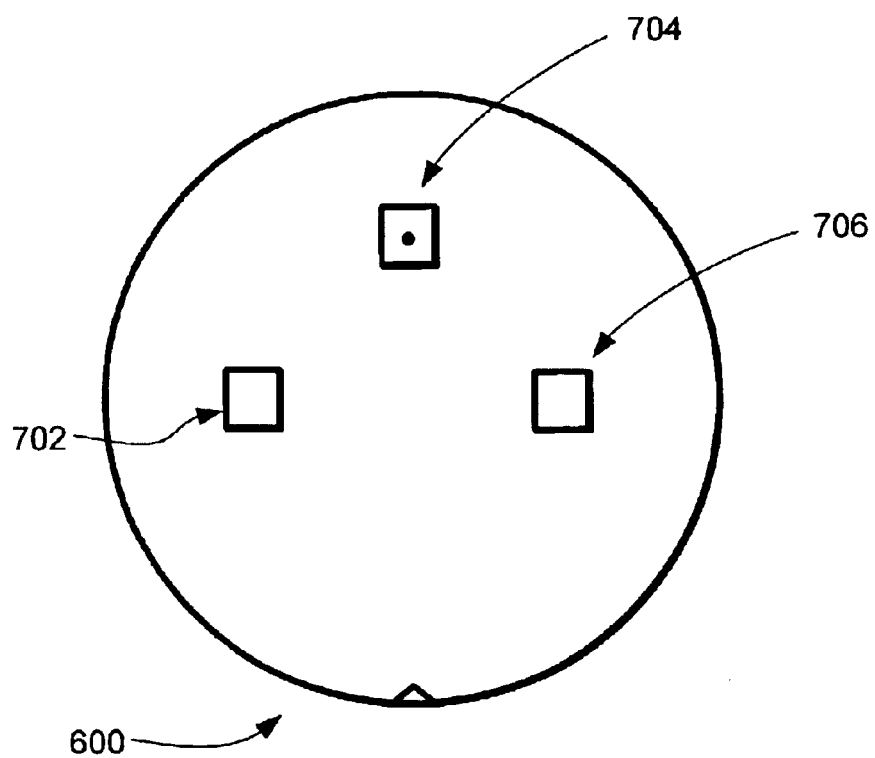
FIG. 7 is a view of the semiconductor wafer after processing in accordance with the present invention.

Referring now to FIG. 7, therein is shown the semiconductor wafer 600 after processing having dies 702, 704, and 706.

By virtue of the image library and sort library it can be determined that only the defect image 604 of FIG. 6 causes the die 704 to be bad. The defect images 602 and 606 of FIG. 6 will be known to produce good dies 702 and 706, respectively.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method for processing tester information comprising:
    collecting data for a plurality of dies on a semiconductor wafer;
    selecting data and a pattern covering the semiconductor wafer;
    graphing selected data in a trellis of graphs spread across the semiconductor wafer; and
    orienting the trellis of graphs over an image of the semiconductor wafer.

2. The method as claimed in claim 1 wherein the collecting data includes collecting electrical data.

3. The method as claimed in claim 1 wherein the selecting data selects data from regular or irregular areas of the semiconductor wafer.

4. The method as claimed in claim 1 wherein the graphing selected data provides a trellis in an array across the semiconductor wafer.

5. The method as claimed in claim 1 wherein the orienting of the trellis is based on an orientation indicator on the semiconductor wafer.

6. A method for processing tester information comprising:
    collecting data for all dies on a semiconductor wafer;
    selecting data and a pattern covering the semiconductor wafer;
    graphing selected data in a trellis of graphs spread across an image of the semiconductor wafer; and
    orienting the trellis of graphs over an outline image of the semiconductor wafer.

7. The method as claimed in claim 6 wherein the collecting data includes collecting data selected from a group consisting of voltage threshold, device current, voltage level, and a combination thereof.

8. The method as claimed in claim 6 wherein the selecting data selects data from a shape selected from a group consisting of a square, rectangle, polygon, arc sector, or a combination thereof of the semiconductor wafer.

9. The method as claimed in claim 6 wherein the graphing selected data provides a plurality of trellises in a two dimensional array across the semiconductor wafer.

10. The method as claimed in claim 6 wherein the orienting of the trellis is based on an orientation notch on the semiconductor wafer.

11. A system for processing tester information comprising:
    means for collecting data for a plurality of dies on a semiconductor wafer;
    means for selecting data and a pattern covering the semiconductor wafer;
    means for graphing selected data in a trellis of graphs spread across the semiconductor wafer; and
    means for orienting the trellis of graphs over an outline of the semiconductor wafer.

12. The system a claimed in claim 11 wherein the means for collecting data includes means for collecting electrical data.

13. The system as claimed in claim 11 wherein the means for selecting data selects data from regular or irregular areas of the semiconductor wafer.

14. The system as claimed in claim 11 wherein the means for graphing provides a trellis in an array across the semiconductor wafer.

15. The system as claimed in claim 11 wherein the means for orienting of the trellis is based on an orientation indicator on the semiconductor wafer.

16. A system for processing tester information comprising:
    means for collecting data for all dies on a semiconductor wafer;
    means for selecting data and a pattern covering the semiconductor wafer;
    means for graphing selected data in a trellis of graphs spread across an image of the semiconductor wafer; and
    means for orienting the trellis of graphs over an outline image of the semiconductor wafer.

17. The system as claimed in claim 16 wherein the means for collecting data includes means for collecting data selected from a group consisting of voltage threshold, device current, voltage level, and a combination thereof.

18. The system as claimed in claim 16 wherein the means for selecting data selects data from a shape selected from a group consisting of a square, rectangle, polygon, arc sector, or a combination thereof of the semiconductor wafer.

19. The system as claimed in claim 16 wherein the means for graphing provides a plurality of trellis in a two dimensional array across the semiconductor wafer.

20. The system as claimed in claim 16 wherein the means for orienting of the trellis is based on an orientation notch on the semiconductor wafer.

* * * * *

UNITED STATES PATENT AND TRADEMARK OFFICE
CERTIFICATE OF CORRECTION

PATENT NO. : 6,815,233 B1
DATED : November 9, 2004
INVENTOR(S) : Erhardt et al.

It is certified that error appears in the above-identified patent and that said Letters Patent is hereby corrected as shown below:

Column 6,
Line 22, delete "a" and insert therefor -- as --
Line 54, delete "trellis" and insert therefor -- trellises --

Signed and Sealed this

Twenty-second Day of February, 2005

JON W. DUDAS
*Director of the United States Patent and Trademark Office*